(12) United States Patent
Stickel et al.

(10) Patent No.: US 6,180,947 B1
(45) Date of Patent: Jan. 30, 2001

(54) MULTI-ELEMENT DEFLECTION ABERRATION CORRECTION FOR ELECTRON BEAM LITHOGRAPHY

(75) Inventors: Werner Stickel, Ridgefield, CT (US); Michael S. Gordon, Lincolndale, NY (US); Hans C. Pfeiffer, Ridgefield, CT (US); Steven D. Golladay, Hopewell Junction, NY (US)

(73) Assignee: Nikon Corporation, Tokyo (JP)

( * ) Notice: Under 35 U.S.C. 154(b), the term of this patent shall be extended for 0 days.

(21) Appl. No.: 09/131,113

(22) Filed: Aug. 7, 1998

(51) Int. Cl.$^7$ ................................................ H01J 37/14
(52) U.S. Cl. .............................. 250/396 ML; 250/396 R
(58) Field of Search ..................... 250/396 R, 396 ML, 250/398, 492.2

(56) References Cited

U.S. PATENT DOCUMENTS

| | | | |
|---|---|---|---|
| 4,214,163 | * 7/1980 | Namae et al. | 250/396 ML |
| 4,245,159 | * 1/1981 | Beisswenger | 250/396 ML |
| 4,475,044 | * 10/1984 | Kuroda et al. | 250/396 ML |
| 5,113,162 | * 5/1992 | Umehara et al. | 250/396 ML |
| 5,466,904 | * 11/1995 | Pfeiffer et al. | 250/396 ML |
| 5,635,719 | * 6/1997 | Petric | 250/396 ML |
| 5,847,402 | * 12/1998 | Nakasuji | 250/396 ML |
| 5,952,667 | * 9/1999 | Shimizer | 250/356 ML |

* cited by examiner

Primary Examiner—Bruce C. Anderson
(74) Attorney, Agent, or Firm—McGuireWoods, LLP

(57) ABSTRACT

A method of optimizing locations of correction elements of a charged particle beam system determines respective corrector element currents to achieve optimum correction as a function of individual corrector location. Substantially complete dynamic correction of FSD and SFD can be obtained consistent with efficiency of operation and minimization of deflection distortion. In particular, FSD and SFD corrections can be sufficiently separated for substantially complete correction of SFD and FSD simultaneously with two stigmators. Both of these types of correction can be provided in complex charged particle beam systems employing curvilinear axis (CVA) particle trajectories and or large area reduction projection optics (LARPO) which cause complex hybrid aberrations in order to achieve high throughput consistent with extremely high resolution supporting one-tenth micron minimum feature size lithography regimes and smaller.

19 Claims, 7 Drawing Sheets

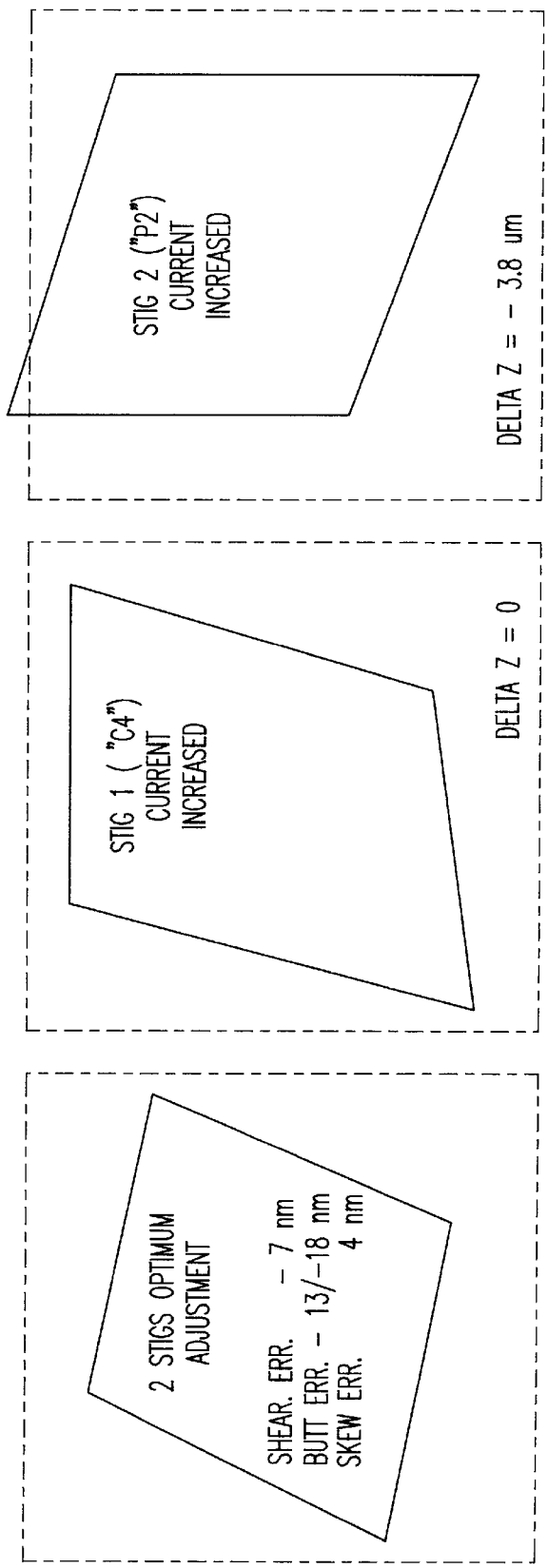

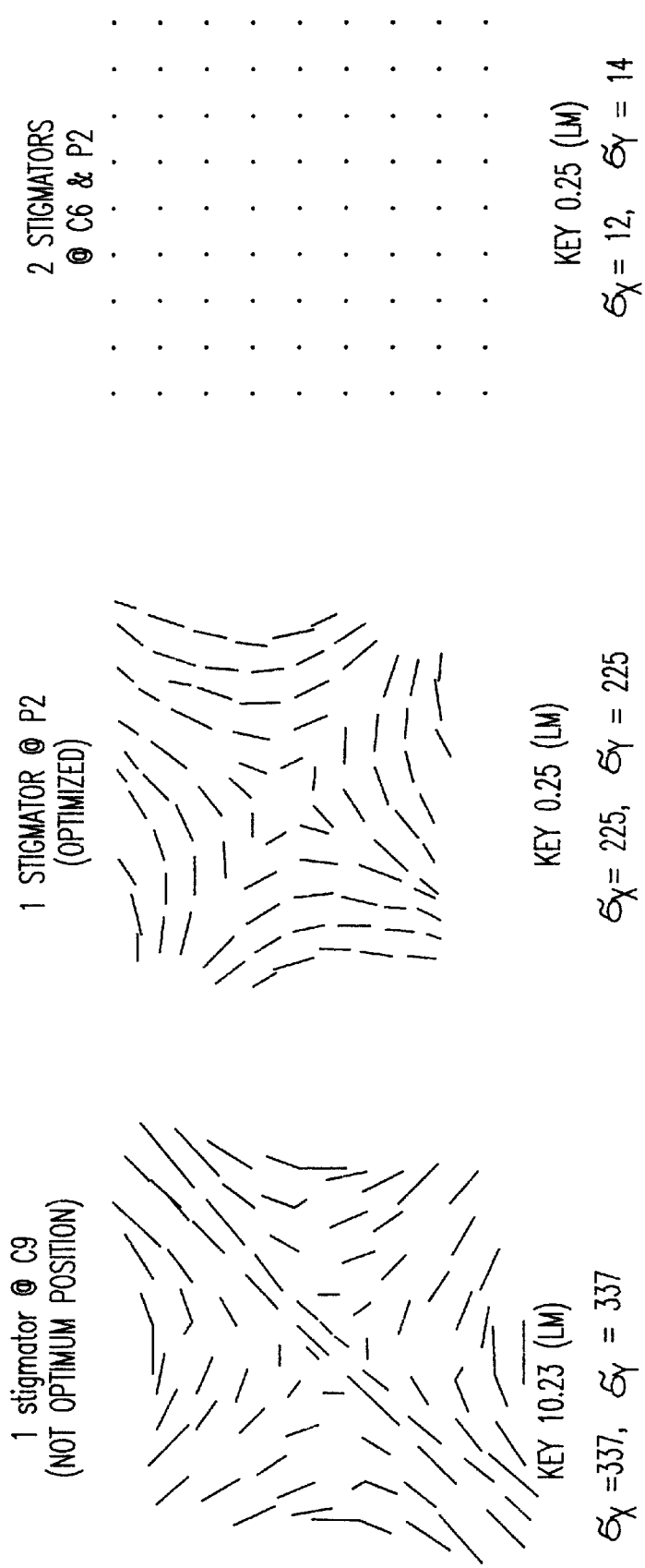

MULTI-ELEMENT DEFLECTION ABERRATION CORRECTION FOR ELECTRON BEAM LITHOGRAPHY

BACKGROUND OF THE INVENTION

1. Field of the Invention

The present invention generally relates to optical correction of charged particle beam tools and, more particularly, to reduction and compensation of aberrations in electron beam (e-beam) projection systems.

2. Description of the Prior Art

Numerous techniques are known utilizing charged particle beams and are in widespread use for manufacture of integrated circuit devices, in particular. For example, charged particle beams are used for implantation of impurities, inspection (e.g. with scanning electron microscopes) of structures for process evaluation and development and for lithographic patterning of substrates and layers deposited thereon.

Essentially, lithography processes define potentially very minute areas and shapes on a surface through selective exposure and removal of portions of a layer of resist to expose areas of the surface for further processing by, for example, etching, implantation and/or deposition. In general, for semiconductor device manufacturing, such exposures of the resist have predominantly been made with electromagnetic radiation (EMR) rather than with charged particle beams.

However, there is a strong incentive in the manufacture of integrated circuits to increase integration density to the greatest possible degree consistent with acceptable manufacturing yields. Device arrays of increased density provide increased performance since signal propagation time is reduced and noise immunity is increased with reduced connection length and capacitance. Further, increased device density on a chip allows greater chip functionality as well as greater numbers of devices which can be manufactured on a chip of a given area. This, in turn, results in increased economy of manufacture if manufacturing yields can be maintained.

Device size and density is a function of the minimum feature size which can be reliably produced in the course of patterning the resist. Minimum feature size is limited by the resolution of the exposure which, in the case of EMR, is essentially determined by the wavelength of the radiation utilized to expose the resist. Wavelengths corresponding to deep ultra-violet (DUV) is used almost exclusively for current integrated circuit manufacturing processes and can produce minimum feature sizes as small as 0.25 microns. While use of DUV lithography (DUVL) may be extended to minimum feature sizes of about 0.13 microns (130 nanometers) it is generally considered that other lithographic exposure techniques such as extreme ultra-violet lithography (EUVL), x-ray lithography (XRL), and charged particle lithography (ion beam projection lithography (IPL) and electron beam projection lithography (EBPL)) will be required at smaller feature sizes.

Among these techniques, electron beam projection lithography has the advantage that electrons can readily be controlled and manipulated by electromagnetic fields acting as lenses, deflectors and correctors. Electron beam projection lithography is also able to produce a plurality of pattern elements or pixels in a single exposure. However, it can be appreciated that e-beam exposure is only viable as an exposure medium for high volume production of integrated circuits (ICs) if a throughput comparable to EMR exposure techniques such as DUVL can be realized. To date, EBPL tools have employed beams which are limited in transverse dimensions to about five microns and therefore contain only limited numbers of pattern elements or pixels, generally on the order of about one thousand pixels or less per exposure. These systems are often referred to (collectively with individual pixel exposure systems) as probe forming systems.

Current IC chip designs, however, include on the order of one billion pixels. This number may increase by a factor of ten to one hundred or more in the foreseeable future. Therefore, a very large number of sequential exposures is required to make an exposure of a complete chip area pattern and throughput of probe-forming systems is unacceptably low. This problem cannot realistically be approached by reduction of shot exposure time in view of the large number of exposures which must still be made.

Therefore, any practical solution must increase the number of pixels which can be exposed simultaneously, in parallel. Ultimately, it would be desirable to expose an entire chip area pattern with a single exposure. However, exposure of such an extensive area is not currently practical for various reasons including distortion and field curvature of the electron-optical system (which are correctable to tolerable residual error over only small areas) and available flatness of a wafer surface over a chip area. Lack of wafer flatness can derive from both wafer manufacture and/or mounting of the wafer in the e-beam exposure tool and is collectively referred to as target height variation. That is, among other practical considerations, focus must be adjusted within sub-fields of chip areas to compensate for field curvature and distortion as well as irregularities of topography of the wafer or other structures formed thereon so that resolution of features of a size that would require e-beam exposure, in the first instance, can be achieved.

A solution which is currently feasible, however, is to project a portion of a chip pattern or sub-field which, while small relative to chip area (e.g. 0.01% of the chip pattern), is large compared to a pixel in probe-forming systems. Generally systems capable of projecting increased numbers of pixels also employ optical reduction of projected image size from a sub-field pattern provided on a reticle, employing what is referred to hereinafter as large area reduction projection optics (LARPO). However, such systems have not heretofore been successfully applied to minimum feature sizes approaching or below one-tenth micron and in which the pattern may include one million pixels or more.

The consequences of extending this approach to smaller minimum feature size regimes include a need to project a sub-field having dimensions of about several tenths of a millimeter on a side as flawlessly as required for pattern fidelity commensurate with ground rules of 100 nm and smaller (e.g. a dimensional tolerance of the image of about 10% to 15% of minimum feature size). Further, in order to cover a chip area which may measure several centimeters on a side, the positioning and shape of the image must be of comparable accuracy and fidelity and achieved at very high speed. This latter requirement further implies that the beam must be deflected off the central axis of the beam generating particle-optic system.

In this regard, those skilled in the art will recognize that a projected electron beam will include imperfections or geometric aberrations of many types and that the number of types of aberrations and their size will increase when the beam is deflected off-axis. Fortunately, some of these aberrations can be corrected dynamically in accordance with beam position by appropriate driving of lenses and correctors in synchronism with deflectors.

In probe-forming systems, there are only two dynamically correctable aberrations: astigmatism and field curvature. These aberrations are respectively correctable with one dual axis quadrupole stigmator and one focusing device forming a correction lens. (The latter is often referred to as a focus coil since it is generally small and has much less inductance than the major lenses of the system. The major lenses of the system cannot, as a practical matter, be dynamically driven for that reason.) Development of appropriate corrections for probe-forming systems is well-known, as is the fact that the alteration of focus will cause both a change in image magnification and rotation of the image.

The effects of magnification change and rotation are, however, negligible for beam sizes (corresponding to a much larger sub-field in LARPO systems) characteristic of probe-forming systems. That is, the beam size and orientation error which results from magnification change or rotation over the small beam transverse dimension will be a tolerably small fraction of the beam size. Further, for such beam sizes, astigmatism affecting shape of a feature within the beam (referred to as feature shape distortion (FSD) in LARPO systems) and astigmatism affecting the shape of the beam (referred to as sub-field distortion (SFD) in LARPO systems) are indistinguishable.

The same is not true for a LARPO system in which correction is substantially more complicated. Specifically, the projected sub-field is much larger than the beam in a probe-forming system and in comparison with minimum feature and pixel size. Therefore, sub-field distortion and feature distortion must be separately compensated since they derive from different sources and locations in the electron-optical column. Further, correction of either type of distortion may affect the magnitude of the other. Similarly, changes in magnification and rotation of the image cannot be ignored when the sub-field size is much larger than the feature size. In LARPO systems utilizing curvilinear variable axis lenses (CVAL), as described in U.S. Pat. No. 5,635,719, which is hereby fully incorporated by reference, additional complexity arises from the superposition of focusing and deflection fields leading to aberrations referred to as "hybrid".

It has been demonstrated, in theory, as described in "a Multistage Deflector Theory" by Hosokawa et al. (Optik 58 (1981), p. 241) that in combination with deflectors, two dual-axis quadrupole stigmators and three focus elements are necessary and sufficient to compensate regular and hybrid astigmatism and field curvature. However, while such a minimum of optical elements may be sufficient, in principle, to achieve such corrections, no practical embodiment is suggested by Hosokawa et al. Moreover, while it is known that single correctors of probe-forming systems must be placed in particular locations to avoid causing additional errors, it is generally considered by those skilled in the art that the placement of multiple focus and astigmatism correction elements is, in theory, not critical in charged particle beam systems since the magnetic field strengths can be adjusted relatively readily by control of the energization currents. Therefore, accepted theory of charged particle optics provides no guidance concerning the location of multiple astigmatism and focus correction elements.

Nevertheless, while it may be accepted theory that two stigmators would be necessary to compensate for the differences in feature shape distortion and sub-field distortion when the two forms of distortion due to astigmatism can be distinguished, it is equally clear that the two stigmators (or the three focus elements) cannot be placed at the same axial location (or closely adjacent each other) without their effects being superimposed to effectively function as fewer elements than theorized to be required. It is also generally accepted, as alluded to above, that correction of sub-field distortion (SFD) and correction of feature shape distortion (FSD) are interrelated in a manner which may be largely unpredictable based on relative stigmator location. Hosokawa et al. provides no guidance in regard to placement or relative energization of such two stigmators in order to simultaneously correct both forms of distortion.

Such high levels of performance of charged particle beam systems as is currently desired from e-beam projection lithography systems, particularly of the LARPO and/or CVAL tppe, has not heretofore been required for commercial purposes or, for that matter, been readily observable. Charged particle projection systems having beams of sufficient size to require such performance have only recently been developed. No prior effort to develop a practical application of the theory of Hosokawa et al. or a working embodiment in accordance therewith is currently known to the inventors. However, it should be recognized that there has been no practical solution to correction of both feature shape and sub-field distortion and/or correction of field curvature while minimizing both image rotation and magnification change, even though practical electron and ion beam devices, the theory of operation and electromagnetic beam control therein and the interaction of correction of types of astigmatism and field curvature has been known for many years.

SUMMARY OF THE INVENTION

It is therefore an object of the present invention to provide an e-beam projection system employing LARPO having the capability of dynamically adjusting focus with varying beam position.

It is another object of the invention to provide an arrangement of optical elements which can provide adjustment of focus and simultaneous compensation of magnification and, if magnetic elements are used, rotation.

It is a further object of the invention to provide control of optical elements which can achieve focus adjustment without causing sub-field magnification change and rotation.

It is yet another object of the invention to provide a high-throughput e-beam lithography system having the capability of adjusting astigmatism, including both feature shape distortion (FSD) and sub-field distortion (SFD), dynamically with variation of beam position.

It is a further object of the invention to provide an arrangement of optical elements which can provide substantially independent correction of FSD and SFD.

In order to accomplish these and other objects of the invention, a method of approximating optimum locations of plural correction elements of a charged particle beam system is provided comprising steps of determining effects of position of each of said plural correction elements with respect to each of a plurality of individual correctable aberrations, and placing each of said plural correction elements at a location to achieve optimum correction of a specific aberration among said plurality of individual correctable aberrations.

In accordance with another aspect of the invention, a charged particle beam projection system including two lenses and two dynamic stigmators is provided wherein a first dynamic stigmator is located close to a center of a first lens and a second dynamic stigmator is located at approximately a center of a second lens.

In accordance with a further aspect of the invention, a charged particle beam projection system including two lenses and three dynamic focus elements wherein a first focus element is located at approximately the center of the first lens, a second focus element is located adjacent to and upstream of the second lens, and a third focus element is located at approximately the center of the second lens.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A, 3B and 3C illustrate the effect of altering excitation current of one stigmator in the presence of another stigmator element with fixed excitation, FIGS. 4A, 4B and 4C illustrate experimental results of optimization of position of a stigmator and further correction with a second stigmator, FIGS. 5A, 5B, 5C and 5D graphically illustrate simulated dependencies of focus coil excitation on focus coil axial location to achieve optimum image correction, FIGS. 6A, 6B, 6C and 6D graphically illustrate results of a simulation of altering excitation of any of three focus coils located at different axial locations, and FIG. 7 graphically illustrates minimization of sub-field rotation and magnification change resulting from focus correction utilizing differential alteration of current in three focus coils to correct for axial image plane shift.

DETAILED DESCRIPTION OF A PREFERRED EMBODIMENT OF THE INVENTION

Figure 1:
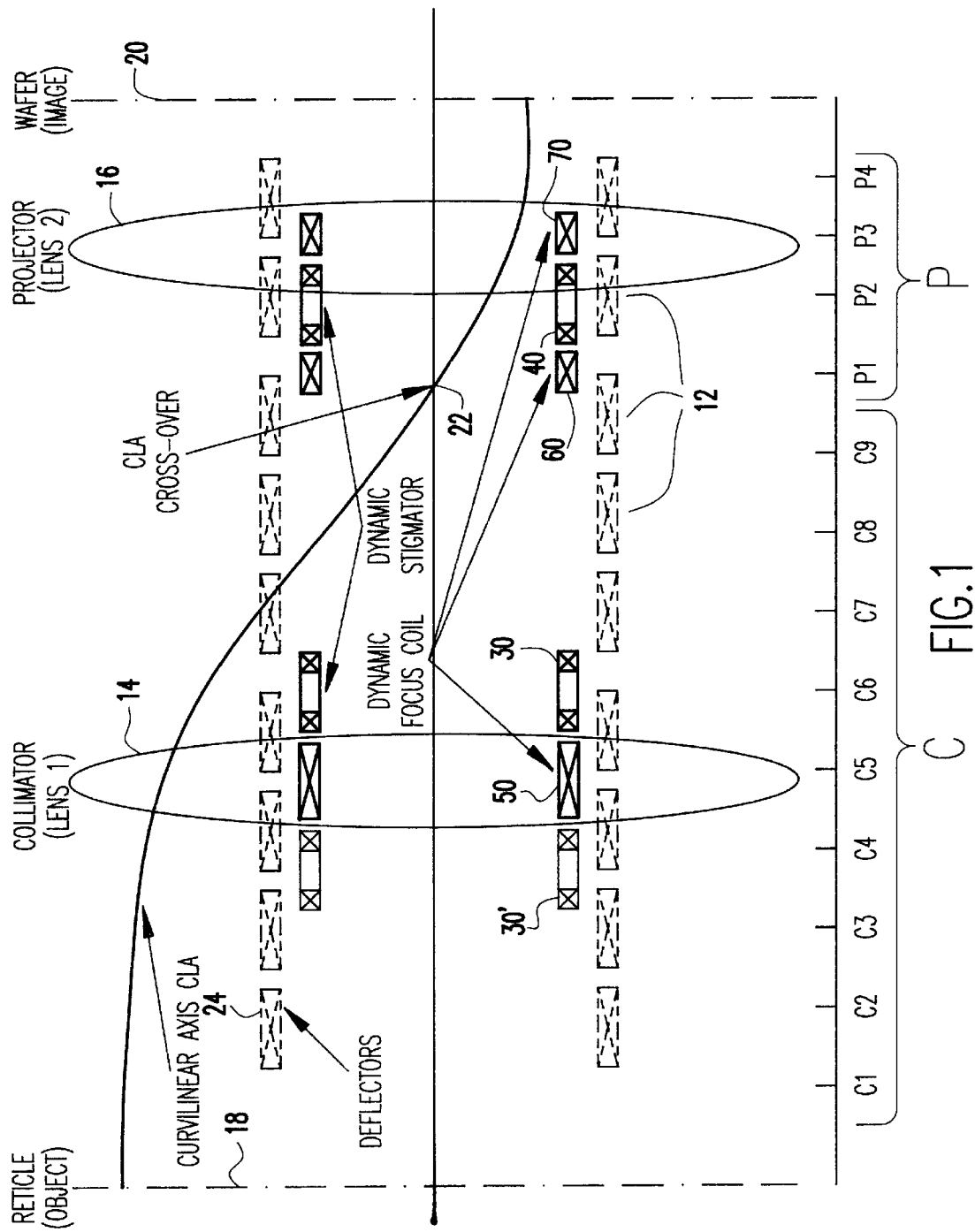
FIG. 1 schematically depicts the reticle imaging optics of a LARPO-CVAL system showing the approximate locations of multiple dynamic correction elements relative thereto in accordance with the invention, FIGS. 2A and 2B graphically illustrate results of a simulation of the dependency of stigmator excitation currents on axial location of any of the stigmators to obtain optimum image correction.

Referring now to the drawings, and more particularly to FIG. 1, there is shown a schematic, cross-sectional view of the reticle imaging optics with key elements of an e-beam projection system employing LARPO and CVAL optics. Elements of the system which are not important to an understanding of the invention, including the remainder of the e-beam column, are omitted in the interest of clarity. Elements illustrated with dashed lines are schematic depictions of coils 12 forming deflectors of the e-beam projection system with which the invention is employed. Distributed lenses of the system are schematically depicted at 14, 16. These coils and lenses are not drawn to scale in size or location and do not specifically depict any particular e-beam projection system. Accordingly, no portion of FIG. 1 or any other Figure in the application is admitted to be prior art in regard to the present invention.

The reticle imaging optics of FIG. 1 are generally divided into a collimator section C and a projector section P, having lenses 14 and 16, respectively. These two lenses form an arrangement which is variously referred to as a symmetric doublet or, sometimes, as an asymmetric doublet (when the lenses provide a reversal of field at the cross-over point). This terminology recognizes that the collimator and projector sections can be appropriately scaled axially and laterally to the reticle (18) and target (20) planes on opposite sides of the CLA crossover point 22 by choice of appropriate focal lengths for lenses 14, 16 in order to provide desired image size reduction; a reduction or demagnification factor of about 4:1 transverse to the system axis being illustrated.

As illustrated, the collimator and projector sections, have axial location indices C1–C9 and P1–P4 applied thereto. These indices are arbitrary and used only for convenience of discussion and reference to axial locations along the e-beam (z) axis. The particular indices illustrated are arranged such that, by convention, index C5 is at the approximate center of lens 14 and index P3 is at the approximate center of lens 16. Indices P1 and P2 are arranged, for convenience, to be on opposite sides of the crossover point 22.

Spacing of the indices is also substantially arbitrary but, in general, reflects relative field strength of the respective lenses at the corresponding axial locations of the e-beam system. Hence, the distance between indices P2 and P3 or P3 and P4 is illustrated as about half the spacing of indices C4 and C5, roughly in accordance with the above-noted demagification. The positions of these indices will therefore differ with different arrangements and constructions of the (magnetic) elements comprising the lenses and deflectors. Accordingly, it should be kept in mind during the following discussion that reference to locations by means of these illustrated indices is merely for convenience in referencing locations by relative distance "upstream" or "downstream" from another index.

Also shown in FIG. 1 are two dual-axis stigmators 30, 40 and three focus elements 50, 60 and 70. The illustrated locations of these elements are approximately as most preferred in the practical embodiment of the invention. These preferred locations, as illustrated, are developed in accordance with the principles of the invention which will be discussed in detail below and which are of general applicability to charged particle beam systems beyond e-beam lithography tools in regard to which the principles of the invention will be explained.

The two lenses 14 and 16 produce an image of a patterned reticle, generally indicated at 18, at a target plane 20, such as a wafer surface. The (magnetic) deflectors (e.g. 24) produce (magnetic) fields superimposed on the field of the lenses which preferably, but not necessarily, develops a beam trajectory which is referred to as a curvilinear axis (CLA) as defined in the above-incorporated patent and may be of a two-dimensional or three-dimensional form. The actual trajectory is variable in accordance with excitation currents applied to the deflectors in accordance with ratios between them which serve to pivot the CLA around point 22 where the beam crosses the geometric axis of the system. Accordingly, any sub-field of the reticle can be selected for imaging at the target. Aberrations caused by this deflection and imaging system are minimized by dynamic correction elements 30, 40, 50, 60 and 70 as will now be explained.

As alluded to above, the location of correction elements has generally been considered to be non-critical to the accomplishment of the desired correction. However, the inventors have found, through simulations, some of the results of which are provided in FIGS. 2A and 2B, as well as experiment, that some criticality and a strong preference for stigmator position does, in fact, exist. Specifically, in the simulation depicted in FIG. 2A with a downstream stigmator positioned arbitrarily at location P2, the currents in each of two stigmators required to minimize feature astigmatism (FSD) were plotted. Corresponding deflection distortion is also plotted as a function of upstream stigmator 30 (stigmator 1) position. Units for each plot in terms of the normalized fractional abscissa values are stated in square brackets. The required current is considered by the inventors to be an indicator of relative efficiency with which correction can be obtained for a given position of stigmator 1.

Figure 2B:
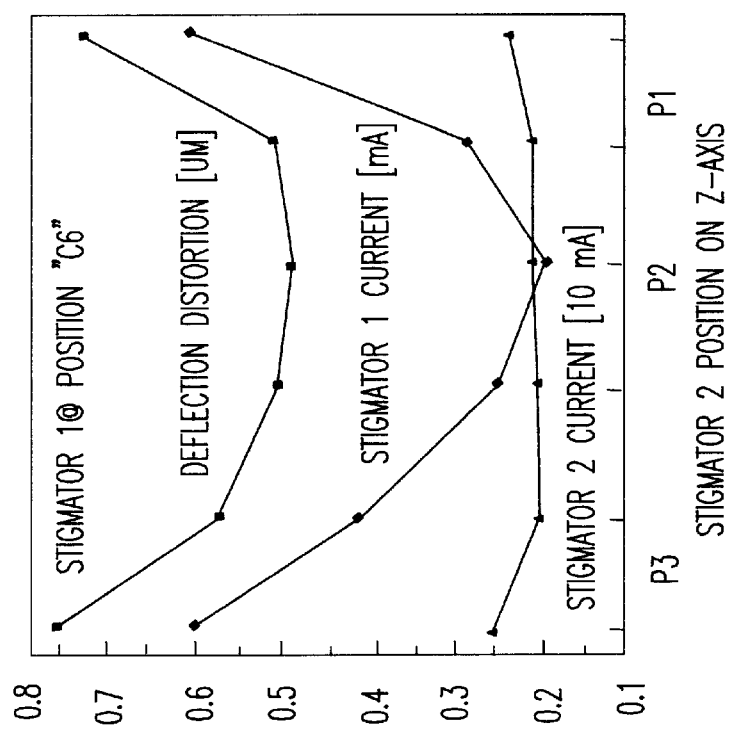
Figure 2A:
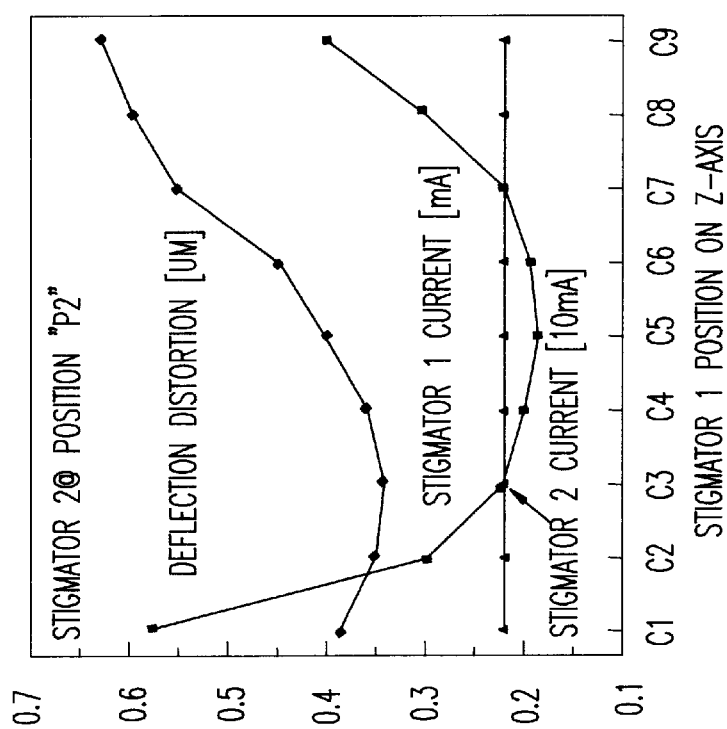

As shown in FIG. 2A, various positions of stigmator 40 result in correction being obtained with currents which exhibit a broad minimum centered at position C5 with the currents being required at position indices C4–C6 being about equal to the current required for a stigmator located at position index C5. The deflection distortion also exhibits a broad minimum centered at about position index C3 with positions C2–C4 being approximately equal. It is significant to note that current in the downstream stigmator 40 (stigmator 2) varies only slightly with the position of stigmator 30.

FIG. 2B is similarly derived with the upstream stigmator 30 arbitrarily (but consistent with the minimum of FIG. 2A) located at position index C6 while stigmator 40 (stigmator 2) is moved from slightly upstream of P1 to slightly downstream of P3. In this case, required current in stigmator 40 to achieve minimum astigmatism exhibits a sharply defined minimum at approximately position index P2 while the current in stigmator 30 is only slightly affected. The deflection distortion also exhibits a sharply defined minimum coincident with the location of stigmator 40 at position index P2.

From FIGS. 2A and 2B it can be readily appreciated that there is not only a strongly preferred location for each of the stigmators 30, 40, but that the location of the downstream stigmator at P2 is particularly critical both in terms of sensitivity and efficiency of astigmatism correction and also for minimization of deflection distortion. (It should also be noted, in this regard, that the horizontal axis of FIG. 2B, as presented, is substantially expanded relative to FIG. 2A and that the P1–P3 indices are spaced much more closely than C4–C6 relative to the axis of the e-beam system as shown in FIG. 1.) By the same token, positioning of stigmator 30 in the vicinity of C4–C6 is strongly preferred with, for this particular e-beam system, a position near C4 or slightly upstream thereof toward C3, indicated at 30', being preferred in view of a reduction of deflection distortion which can be concurrently achieved. No prior quantitative demonstration of these dependencies is known to the inventors and is considered to be a basic principle of the invention and fundamental to the practice thereof.

Referring now to FIGS. 3A–3C, results of a simulation of the effects of arbitrary incremental proportional changes in stigmator current of each stigmator is shown. Specifically, the dashed rectangle in each of these Figures illustrates the ideal sub-field shape (as distinct from feature shape) and the solid lines represent actual (though exaggerated) distortion of the sub-field shape (SFD). FIG. 3A thus represents residual SFD when SFD and FSD are minimized. In this particular case, the sub-field is slightly smaller, slightly rhomboid and irregular (opposite sides are not parallel) in shape and slightly rotated from the ideal.

As shown by FIG. 3B, if current is increased in a stigmator 30 located at position C4, the subfield shape is made more nearly a rectangular parallelogram. Focus does not shift with this current change nor does feature shape distortion (FSD) by any significant amount. If, however, as shown in FIG. 3C, the current of stigmator 40 at index P2 is differentially increased by a like proportion to that of stigmator 30 in FIG. 3B, a near parallelogram results of comparable size, with the acute angles being reversed as compared with FIGS. 3A and 3B. The accompanying focus shift, however, while seemingly small, is indicative of and accompanied by a very significant change of feature shape (FSD), causing an image blur which is calculated, for this example, as being about 50%. From these results, it can be concluded that the effects which stigmators 30 and 40 have on FSD relative to SFD are very different from each other with stigmator 30 acting predominantly on SFD and stigmator 40 having roughly comparable effects on both SFD and FSD.

It is therefore clear that the choice of axial positions explained above in regard to FIGS. 1–3C for the stigmators is not merely beneficial in terms of excitation requirements or corrective sensitivities but for the clear separation of effects of the stigmators 30, 40 between FSD and SFD. This discrimination, supported by the predominance of the effect of stigmator 30 on SFD, is the basis for a preferred embodiment with the essential and practical advantage that the optimum adjustment of two stigmators in a practical lithography system for a manufacturing environment is made possible with a minimum of iterations and time consumption which, in regard to any different arrangement, could lead to unacceptable system down times or, worse, to the inability to converge the iterative process on the optimum condition.

Without wishing to be held to any particular theory of the reasons for the different effects shown in FIGS. 3B and 3C, FIGS. 3A–3C and 2A–2B can be generally understood as demonstrating for the general case that astigmatism correction applied at an axial location where the size of the sub-field image is large (especially in comparison with feature image size within the beam) causes the effect on the sub-field shape of a change in response to a change in stigmator current to strongly dominate over effects on FSD while effects on both FSD and SFD are more nearly comparable when astigmatism correction is applied near the crossover point 22 and/or upstream of the center of the projector section P where the sub-field shape becomes undefined and the features intermixed.

This is due to the fact that rays originating from any object point are mingling with rays from all other object points to form an image replica of the electron source upstream of the doublet, described above, at the CLA cross-over point 22. The effect of stigmator 40 on FSD is nearly equal to the effect on SFD in some arrangements when stigmator 40 is positioned very close to the crossover point 22 (between position indices P1 and P2). In any case, it is clear that correction of FSD and SFD can be effectively separated to a degree sufficient for differential correction to effectively minimize both forms of astigmatism or distortion.

By whatever physical mechanism these differential effects may be achieved, FIG. 4 presents dramatic experimental confirmation that such differential and selective correction of FSD and SFD can be achieved. Recalling from the discussion of FIG. 2 that the location of stigmator 40 at position index P2 was shown to be relatively critical, FIG. 4A shows the SFD and the relatively large accompanying feature location shift if a single stigmator is used and non-optimally located at position index C9 between those positions which are considered to be respectively preferred for the combination of two stigmators. The standard deviation of the distribution describing the shifts of the feature locations from the desired locations is 337 nm or more than three times the largest regime of minimum feature sizes sought to be obtained from the LARPO system.

With the stigmator 40 optimally located at position index P2 close to or slightly downstream of the crossover and far upstream of the maximum of the projector lens 16 field (but without use of a second stigmator), the corresponding standard deviation, while large, is reduced by over 30% to 225 nm and the direction of shift of sub-field locations is radically altered, much in the manner suggested by a comparison of FIGS. 3A and 3C. When supplemented by a second stigmator approximately optimally positioned at position index C6 close to the collimator lens field maximum, in accordance with the above discussion of FIG. 2, the SFD can be seen to be substantially fully corrected and exhibiting a standard deviation of only 12 to 14 nm, approaching a 10% tolerance for a one-tenth micron or 100 nm minimum feature size regime.

Referring now to FIG. 5, the optimization of locations of dynamic focus elements 50, 60 and 70 will now be discussed. As alluded to above, it has been generally considered that the location of focus elements is not critical to focus correction (e.g. dynamic correction for field curvature at the target as a function of deflection). However, it can be readily understood that since any magnetic focus element produces a field in the direction of the beam current, positioning of two or more dynamic focus coils in close axial proximity readily causes their fields to be superimposed such that they function as a single focus element.

Figure 5A:
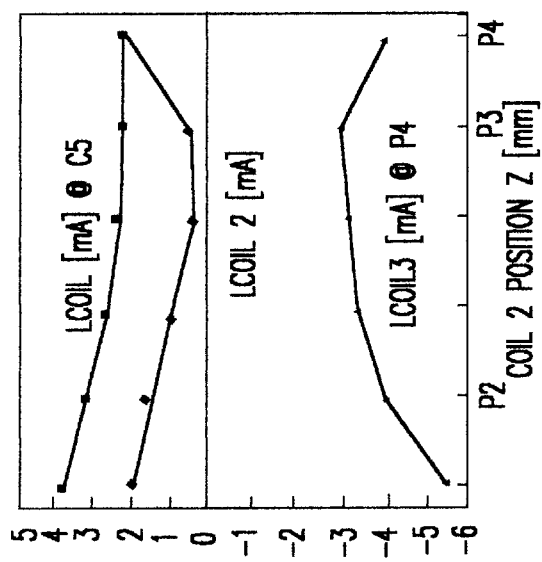
Figure 5C:
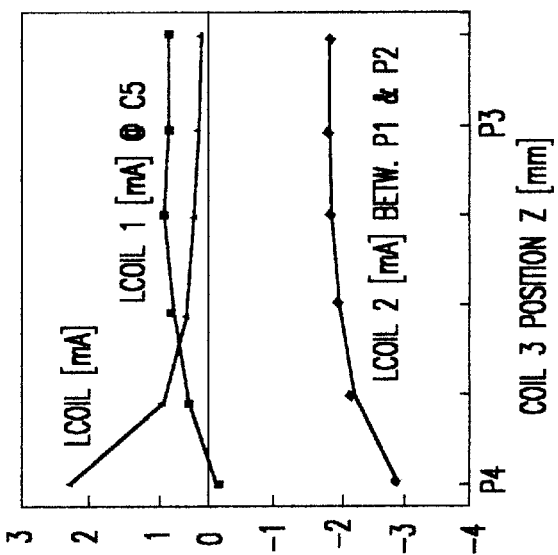

Accordingly, when simulations are conducted for focus coils 50, 70 respectively located in the collimator and projector sections of the projection system of FIG. 1 and currents required for best focus as a function of focus coil position, slight minima are observed in FIGS. 5A, 5C (which is an expansion of a portion of FIG. 5B) and 5D for the currents required in respective focus coils 50, 70 in order to achieve best focus and flatness of field. The complementary focus coil (e.g. 50, coil 1, when coil 70 is moved and vice-versa) as well as coil 2 (60)) also exhibits a slight maximum (e.g. a minimum current in the opposite sense) or minimum corresponding to the minimum current of the shiftable coil.

Figure 5B:
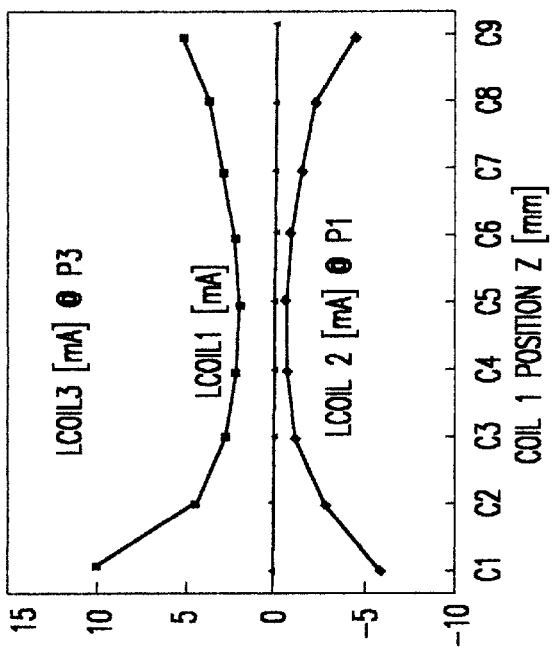
Figure 5D:
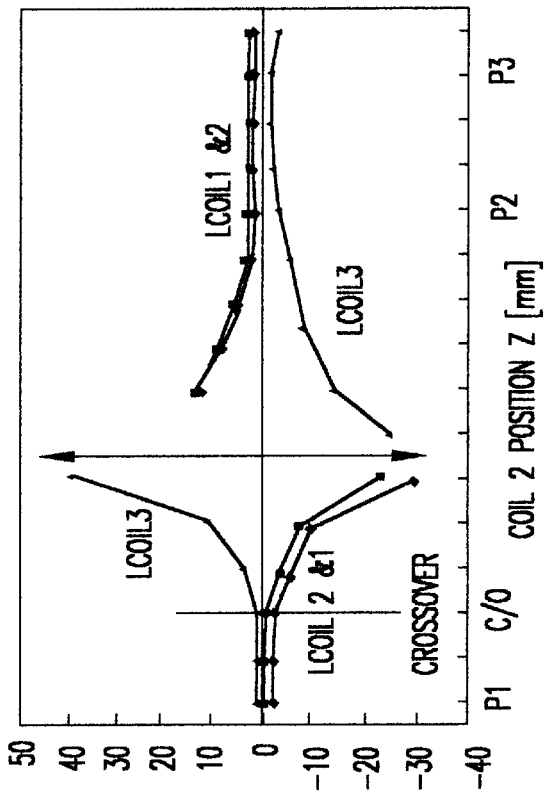

As shown in FIG. 5B, however, and contrary to the generally accepted concept that location of focus correction elements is not critical, location of focus coil 60 (coil 2) at a specific location between the crossover point 22 and position index P2 (about midway between position indices P1 and P2) causes current in all three coils to increase rapidly as focus correction is made and, in fact, full focus correction cannot be achieved with focus corrector 60 so located. The inventors are not aware of this critical singularity having been previously discovered or reported in the scientific literature.

Accordingly, it is critical to the practice of the invention to avoid placement of a focus correction coil at such a point. By the same token, the conclusion one may draw from the theory of Hosokawa et al., alluded to above is incorrect to the extent of the sufficiency of only the number and not the positions of two stigmators and three focus elements to correct regular and hybrid astigmatism and field curvature.

Accordingly, it is preferred to place the focus correction coils at locations where respective currents are at a near minimum (for efficiency) and the required currents are well-behaved. Thus from FIG. 5A, it is preferred to place coil 1 (50) in the vicinity of position index C5 which is at the location of the maximum field of lens 14. Similarly, from FIG. 5D, it is preferred to place coil 3 (70) in the vicinity of position index P3 which is approximately coincident with the maximum field of the projection lens 16.

From FIG. 5C and 5B it is preferred to place coil 2 (60) at a location slightly upstream from the crossover point in the vicinity of position index P1. While a relative minimum current for coil 2 (60) is shown in FIG. 5C near position index P3, corresponding currents in coils 50 and 70 are significant (and larger than the sum of currents between the cross-over and P1 as shown in FIG. 5B) and, further, such a position is both too close to coil 3 (70) to avoid effective superposition of their fields and too close to the singularity discussed above for reliable and/or efficient operation. Further, it may not generally be physically possible to place coils 60 and 70 at positions so axially proximate as FIG. 5C, alone, would tend to indicate to be optimum.

Figure 6B:
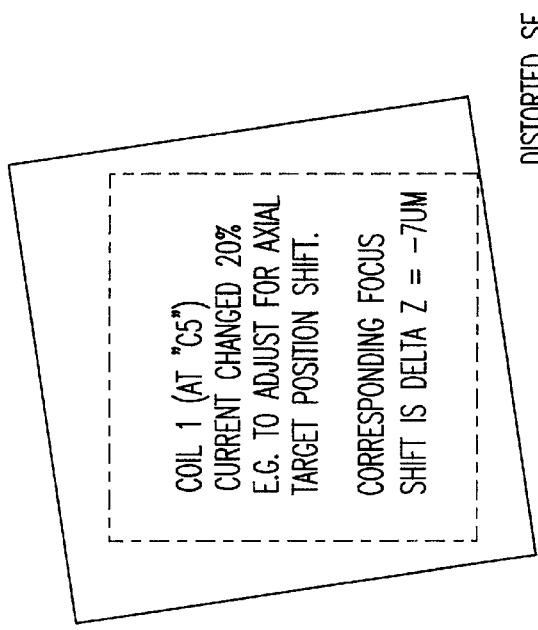
Figure 6D:
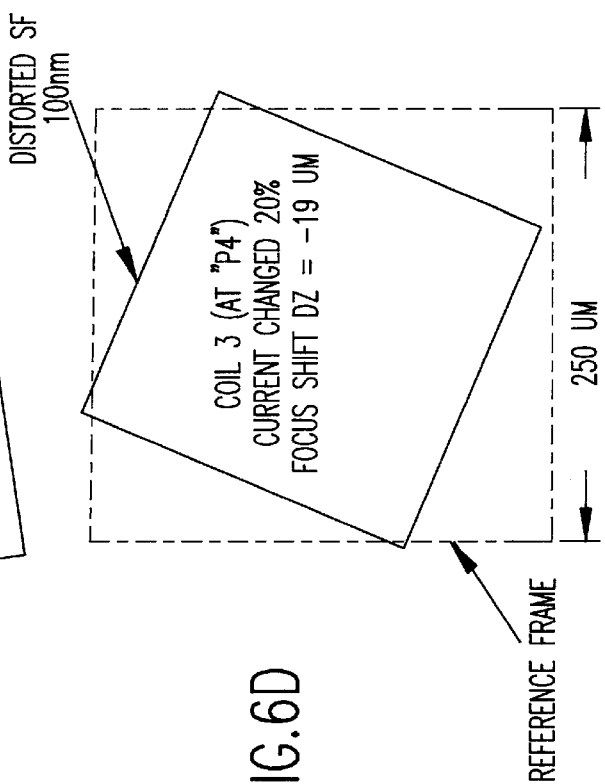
Figure 6A:
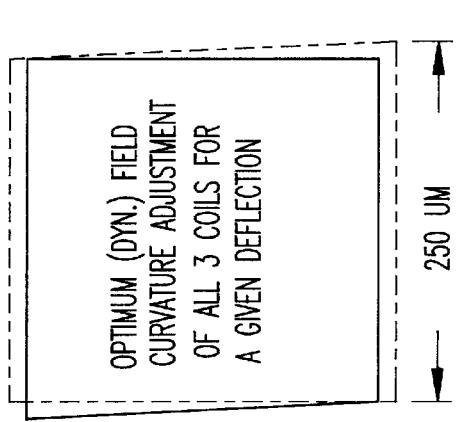
Figure 6C:
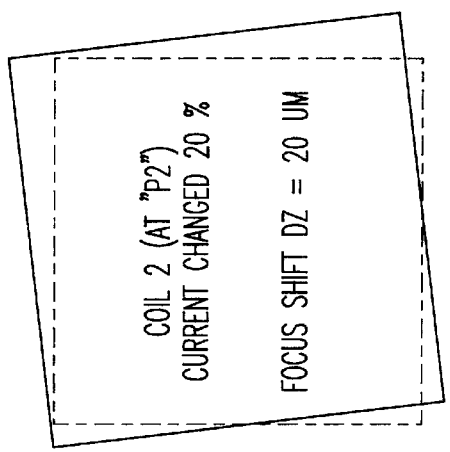

FIGS. 6A–6D are analogous to FIGS. 3A–3C. FIGS. 3A and 6A are identical in showing (exaggerated) residual SFD relative to a reference frame shown in dotted lines. FIGS. 3B–3D show effects of proportional increases (e.g. 20%) in the drive currents of each of coils 50, 60, 70. Again, it is seen that separate effects of increase of current in each coils are highly distinct. Comparing FIGS. 6B and 6D, equal percentage increase in current produces opposite rotation and magnification change but focus shift in the same z direction. Both exhibit different changes in magnification but in different senses (increase of coil 1 current magnifies the image while increase in coil 3 current demagnifies and to a greater degree). Comparing FIG. 6C with FIGS. 6B and 6D, it is seen that rotation is about the same as shown in FIG. 6B, but magnification change is less than in FIGS. 6B and 6D. The focus shift is about equal but opposite to that depicted in FIG. 6D.

The errors of sub-field stitching (e.g. how the sub-field images are made to tile the target plane) of interest are referred to as butt error, which results from change of magnification causing errors in alignment of features in abutting sub-field patterns, and shear error, which results from rotation and tends to cause overlap and/or separation at corners of respective adjacent sub-fields. Since rotation and magnification change are geometrically independent, butt and shear errors are also independent and can be plotted orthogonally and the combinations of rotation and magnification change can be represented as vectors in the "butt error-shear error" plane. Such a depiction also provides a graphical solution for combining the unavoidable rotations and changes in magnification to substantially eliminate both during focus/field curvature correction, as will now be discussed in regard to FIG. 7.

Figure 7:
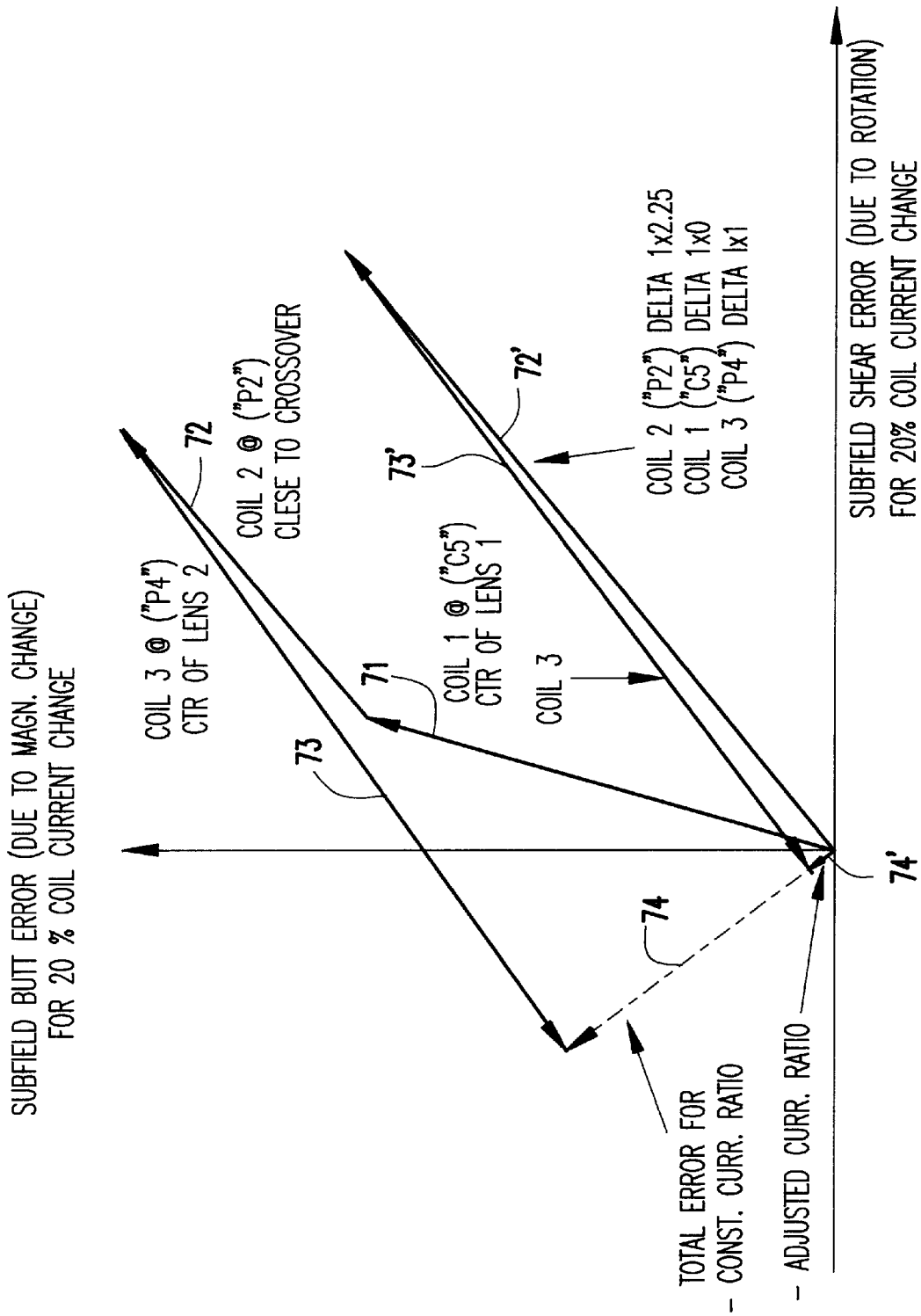

It can be readily observed from FIG. 7 that vectors 71 and 72 (corresponding to the effects of proportional changes in current in coils 50 and 60, respectively) are generally similar in magnitude but markedly different in direction while vectors 72 and 73 (corresponding to the effects of proportional changes in current in coils 60 and 70, respectively) are very nearly opposite in direction but markedly different in magnitude. Therefore, if the ratios of changes in current of coils 60 and 70 are adjusted to achieve similar magnitude, as shown by vectors 72' and 73' (e.g. 1:2.25) rotation and magnification change can be very nearly balanced for any required focus shift while limiting (essentially avoiding) need for any change in current in focus coil 50 as can be seen by comparison of total error vectors 74 and 74'.

Thus, when focus coils are approximately optimally located as discussed above, field curvature can be dynamically corrected as a function of deflection without significant rotation or magnification change, as shown in FIG. 6A on an enlarged scale, by providing correction currents in a ratio which balances these effects. To provide any desired focus correction in response to axial target shift, sub-field stitching can be maintained across the chip area and wafer, and the across chip linewidth variation (ACLV) can be held to a minimum. It should also be appreciated that since the total error is reduced to a very low level by this technique, further closeness of alignment and complementarity of vectors 72', 73' can usually be achieved by fine adjustment of focus coil location and extrapolation without significant experimentation.

In view of the foregoing, it is seen that certain locations for stigmators and focus coils are strongly and specifically preferred in a charged particle beam projection system, particularly if LARPO and/or CVAL is employed. These preferred locations can be closely approximated based on currents required to achieve optimal astigmatism and focus correction, respectively. When correctors are so located, essentially complete dynamic correction of both astigmatism and field curvature, including hybrid terms, can be achieved by adjustment of relative excitation current changes of two stigmators and three focus coils in accordance with deflection. The invention thus counter-intuitively provides optimization of efficiency while optimizing performance and simultaneously allows minimization of deflection distortion, as well.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of approximating optimum locations of plural correction elements of a charged particle beam system, said method comprising steps of determining effects of position of each of said plural correction elements with respect to each of a plurality of individual correctable aberrations, and placing each of said plural correction elements at a location to achieve optimum correction of a specific aberration among said plurality of individual correctable aberrations.

2. A method as recited in claim 1, wherein said plural correction elements comprise two dynamic stigmators.

3. A method as recited in claim 2, wherein one of said two dynamic stigmators essentially compensates sub-field distortion and associated higher order or hybrid aberrations dynamically as a function of deflection.

4. A method as recited in claim 2, wherein one of said two dynamic stigmators essentially compensates feature shape distortion and associated higher order or hybrid aberrations dynamically as a function of deflection.

5. A method as recited in claim 2, wherein determination of optimum excitations of said two stigmators is achieved with a minimum of iterative steps.

6. A method as recited in claim 1, wherein said plural correction elements comprise two dynamic focus lenses.

7. A method as recited in claim 6, including further steps of altering a ratio of excitation from the ratio adjusted for optimum compensation of field curvature and associated higher order or hybrid aberrations to minimize subfield magnification change and rotation occurring in response to focus adjustment for an altered axial target plane position.

8. A method as recited in claim 1, wherein said step of determining the effects of said plural correction elements includes the step of determining current required in each of said plural correction elements to achieve optimum correction as a function of position of each of said plural correction elements, and wherein said step of placing each of said plural correction elements includes placing each of said plural correction elements at a location which approximately corresponds to a minimum current required for said optimum correction.

9. A method as recited in claim 8, wherein said plural correction elements comprise two dynamic stigmators, including the further step of determining deflection distortion as a function of position of each of said dynamic stigmators, and adjusting said location of each said dynamic stigmator element in accordance with a minimum of said deflection distortion.

10. A method as recited in claim 9, wherein said plural correction elements comprise three dynamic focus coils and two stigmators.

11. A method as recited in claim 9, wherein said plural correction elements comprise two stigmators.

12. A method as recited in claim 8, wherein said plural correction elements comprise three dynamic focus coils.

13. A method as recited in claim 12, including the step of altering excitation currents in two of said three focus coils in a ratio which substantially balances rotation and magnification change effects.

14. A method as recited in claim 8, wherein said plural correction elements comprise two stigmators.

15. A charged particle beam projection system including two lenses and two dynamic stigmators wherein a first of said two dynamic stigmators is located close to a center of a first lens of said two lenses and a second of said two dynamic stigmators is located at approximately a center of a second lens of said two lenses.

16. A system as recited in claim 15, wherein said first dynamic stigmator is adjusted in location in accordance with change of deflection distortion with change of location of said first dynamic stigmator.

17. A system as recited in claim 15, further including three dynamic focus elements.

18. A system as recited in claim 17, wherein a first focus element of said three focus elements is located at approximately said center of said first lens, a second focus element of said three focus elements is located adjacent to and upstream of said second lens, and a third focus element of said three focus elements is located at approximately said center of said second lens.

19. A charged particle beam projection system including two lenses and three dynamic focus elements wherein a first focus element of said three focus elements is located at approximately said center of said first lens, a second focus element of said three focus elements is located adjacent to and upstream of said second lens, and a third focus element of said three focus elements is located at approximately said center of said second lens.

* * * * *